Figure 4:
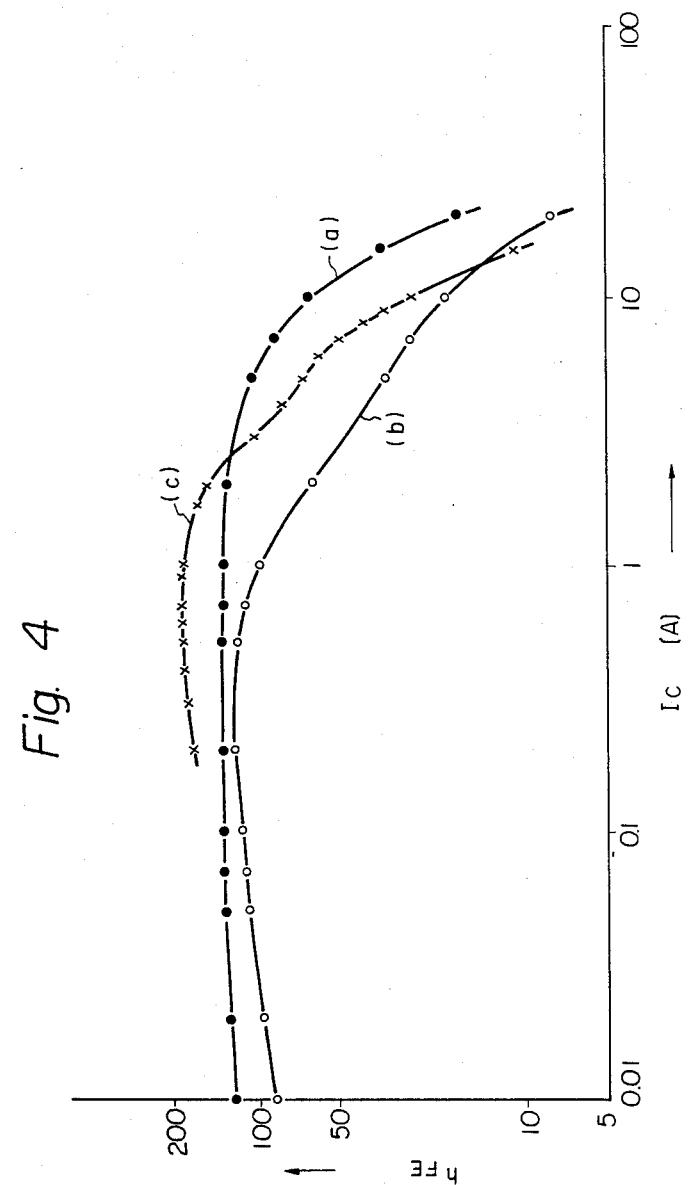
Figures 8, 9, 10:
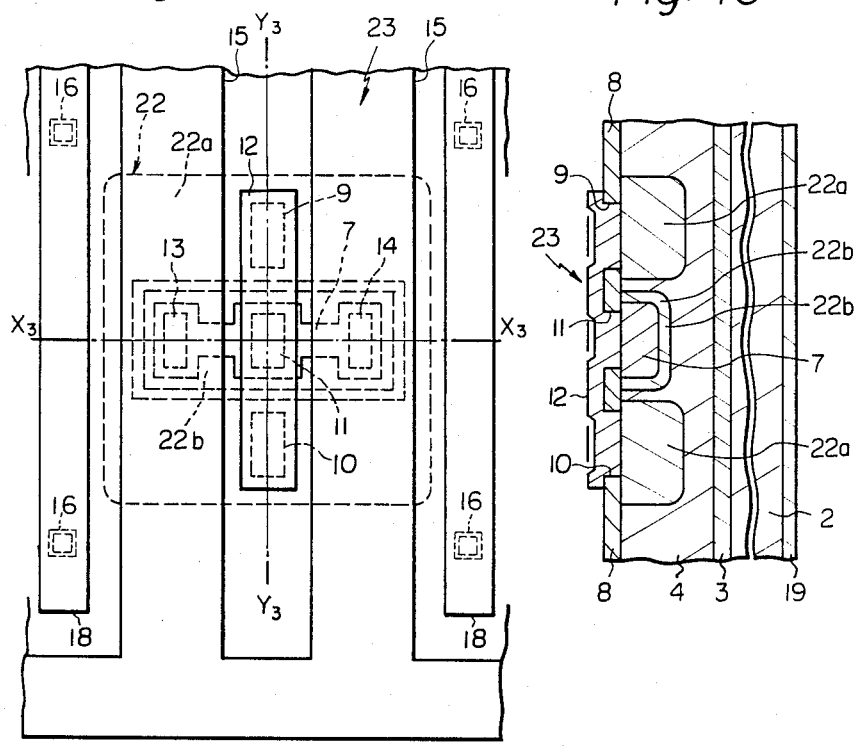

United States Patent [19]

Nawata et al.

[11] Patent Number: 4,835,588

[45] Date of Patent: May 30, 1989

[54] TRANSISTOR

[75] Inventors: Yoshiaki Nawata, Yokohama; Kunihisa Ono, Hatano; Koji Takahashi, Kamakura; Yoshiyasu Kanno, Kawasaki, all of Japan

[73] Assignee: Fujitsu Limited, Kawasaki, Japan

[21] Appl. No.: 173,131

[22] PCT Filed: Mar. 9, 1979

[86] PCT No.: PCT/JP79/00059

§ 371 Date: Nov. 2, 1979

§ 102(e) Date: Nov. 2, 1979

[87] PCT Pub. No.: WO79/00736

PCT Pub. Date: Oct. 4, 1979

[30] Foreign Application Priority Data

Mar. 10, 1978 [JP] Japan .................. 53-27255

[51] Int. Cl.$^4$ .................. H01L 29/72; H01L 29/08
[52] U.S. Cl. .................. 357/36; 357/51; 357/86
[58] Field of Search .................. 357/36, 34, 28, 51, 357/20, 86

[56] References Cited

U.S. PATENT DOCUMENTS

| | | | |
|---|---|---|---|
| 3,358,197 | 12/1967 | Scarlett | 357/36 |
| 3,427,511 | 2/1969 | Rosenzweig | 357/36 |
| 3,504,239 | 3/1970 | Johnson et al. | 357/36 |
| 3,519,898 | 7/1970 | Nakatani | 357/36 |
| 3,740,621 | 6/1973 | Carley | 357/36 |
| 4,151,542 | 4/1979 | Yajima et al. | 357/51 |
| 4,157,561 | 6/1979 | Nawata et al. | 357/36 |
| 4,266,236 | 5/1981 | Ueda | 357/51 |

FOREIGN PATENT DOCUMENTS

| | | |
|---|---|---|
| 46-40454 | 11/1971 | Japan . |
| 51-34209 | 8/1976 | Japan .................. 357/36 |
| 52-63073 | 5/1977 | Japan . |
| 53-122168 | 8/1978 | Japan . |
| 54-54272 | 4/1979 | Japan . |
| 54-56571 | 4/1979 | Japan . |

OTHER PUBLICATIONS

*RCA Power Transistors* (technical series PM 81, published by RCA, Somerville, J.J., 1971), pp. 23—33.

Primary Examiner—William D. Larkins
Attorney, Agent, or Firm—Staas & Halsey

[57] ABSTRACT

In a transistor wherein a plurality of emitter regions are formed in a base region, resistor regions which have the opposite conductivity type to the conductivity type of the emitter regions and which act as stabilizing resistors, are formed in the emitter regions. The resistors regions are commonly connected through an emitter wiring electrode or electrodes, and each of the resistor regions is connected to the emitter region corresponding thereto. In order to allow the conductor for connecting each of the resistor regions to the emitter region corresponding thereto to be arranged on a chip without intersecting the emitter wiring electrode or electrodes, the emitter regions are arranged in a line or lines, and the resistor regions are formed in the emitter regions so as to intersect the line or lines.

8 Claims, 9 Drawing Sheets

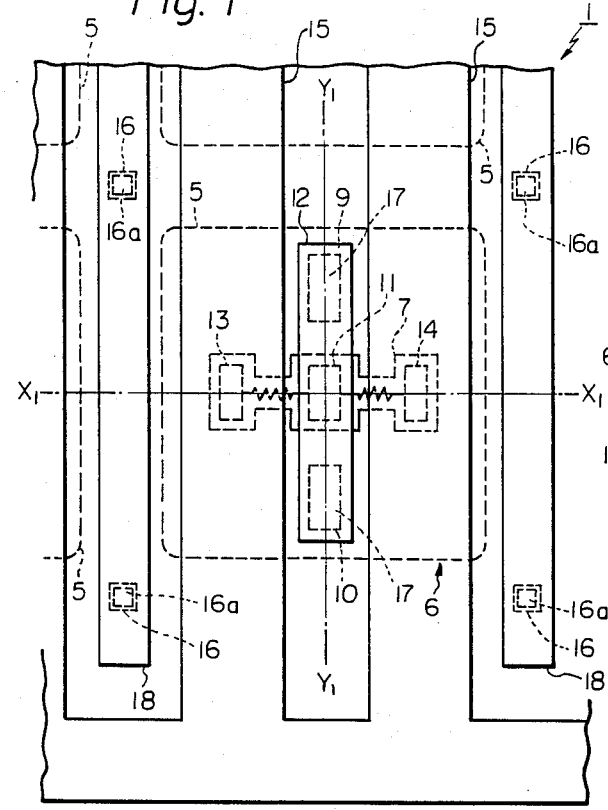
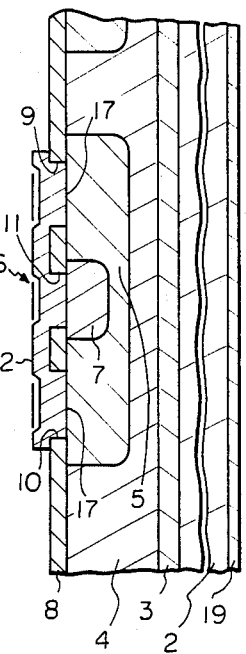
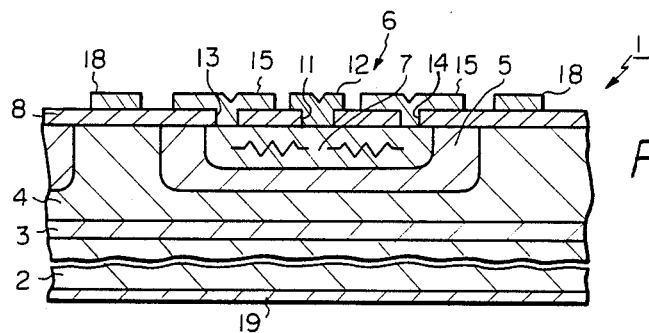

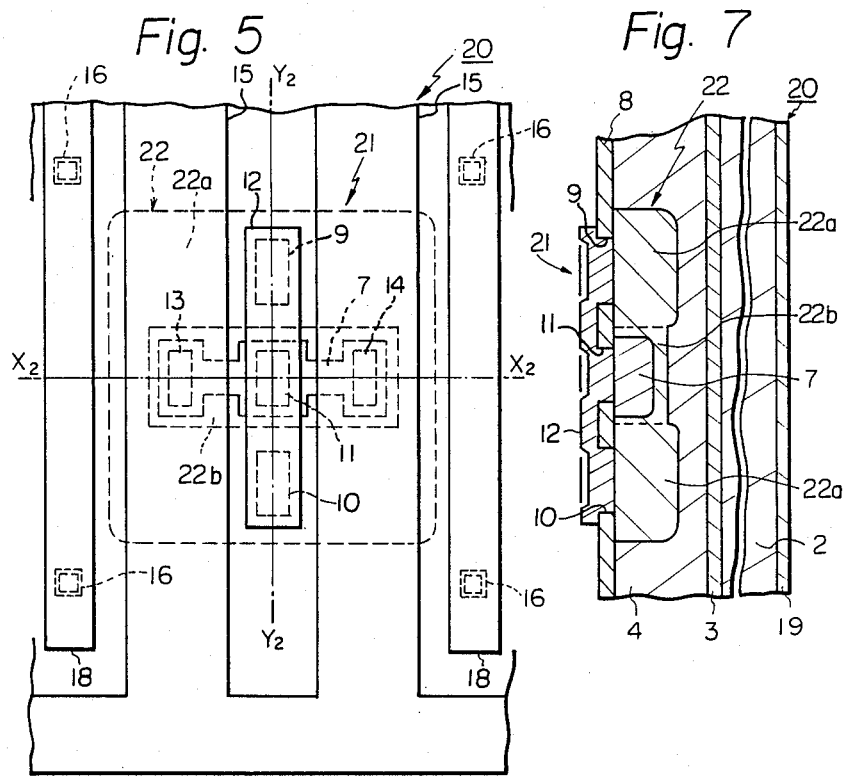
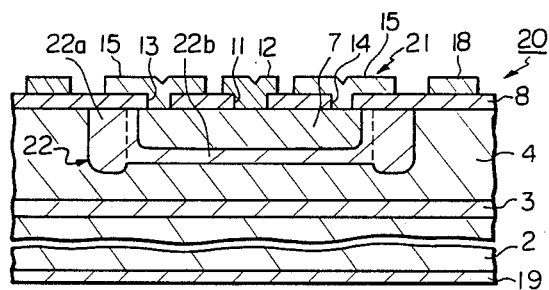

UNITED STATES PATENT AND TRADEMARK OFFICE
CERTIFICATE OF CORRECTION

PATENT NO. : 4,835,589

DATED : May 30, 1989

INVENTOR(S) : James Ruhl Pfiester

It is certified that error appears in the above-identified patent and that said Letters Patent is hereby corrected as shown below:

In claim 13, column 6, line 28, before "formed" insert --type--.

In claim 13, column 6, line 28, after "surface and" delete "type".

Signed and Sealed this

Tenth Day of April, 1990

Attest:

HARRY F. MANBECK, JR.

*Attesting Officer*  *Commissioner of Patents and Trademarks*